United States Patent
Al-Amri

(10) Patent No.: US 11,575,347 B1
(45) Date of Patent: Feb. 7, 2023

(54) PASSIVE COOLING METHOD FOR HIGH CONCENTRATING PHOTOVOLTAIC

(71) Applicant: Imam Abdulrahman Bin Faisal University, Dammam (SA)

(72) Inventor: Fahad G. Al-Amri, Dammam (SA)

(73) Assignee: Imam Abdulrahman Bin Faisal University, Dammam (SA)

( * ) Notice: Subject to any disclaimer, the term of this patent is extended or adjusted under 35 U.S.C. 154(b) by 0 days.

(21) Appl. No.: 17/938,855

(22) Filed: Oct. 7, 2022

Related U.S. Application Data

(63) Continuation of application No. 17/088,695, filed on Nov. 4, 2020.

(51) Int. Cl.
| | |
|---|---|
| *H01L 31/042* | (2014.01) |
| *H02S 10/00* | (2014.01) |
| *H02S 40/20* | (2014.01) |
| *H02S 40/42* | (2014.01) |
| *H02S 40/22* | (2014.01) |
| *H01L 31/0725* | (2012.01) |
| *H01L 31/054* | (2014.01) |
| *H01L 31/0687* | (2012.01) |
| *H02S 20/32* | (2014.01) |

(52) U.S. Cl.
CPC ........ *H02S 40/425* (2014.12); *H01L 31/0547* (2014.12); *H01L 31/0687* (2013.01); *H01L 31/0725* (2013.01); *H02S 20/32* (2014.12); *H02S 40/22* (2014.12)

(58) Field of Classification Search
CPC ........ H02S 40/425; H02S 20/32; H02S 40/22; H01L 31/0547; H01L 31/0687; H01L 31/0725
See application file for complete search history.

(56) References Cited

U.S. PATENT DOCUMENTS

| | | | | |
|---|---|---|---|---|
| 4,372,377 | A * | 2/1983 | Morris | F28D 15/04 |
| | | | | 29/890.032 |
| 2005/0072461 | A1* | 4/2005 | Kuchinski | H01L 31/0687 |
| | | | | 136/244 |
| 2007/0251569 | A1 | 11/2007 | Shan et al. | |
| 2008/0283116 | A1* | 11/2008 | Banin | H02S 40/44 |
| | | | | 136/248 |
| 2011/0005576 | A1 | 1/2011 | Bullen et al. | |
| 2014/0373900 | A1 | 12/2014 | Lamkin et al. | |
| 2015/0162473 | A1* | 6/2015 | Chen | H02S 40/42 |
| | | | | 136/246 |
| 2018/0315877 | A1 | 11/2018 | Kelzenberg et al. | |

FOREIGN PATENT DOCUMENTS

WO WO 96/24954 8/1996

* cited by examiner

*Primary Examiner* — Angelo Trivisonno
(74) *Attorney, Agent, or Firm* — Oblon, McClelland, Maier & Neustadt, L.L.P.

(57) ABSTRACT

A method of passive cooling for a high concentrating photovoltaic, the high concentrating photovoltaic, includes a photovoltaic receiver, a parabolic dish reflector and a plurality of thermally conductive heat pipes having a direct thermal contact between the receiver and the reflector to transfer excessive heat. The method includes receiving sunlight by the parabolic dish reflector, reflecting the sunlight towards the photovoltaic receiver that converts the sunlight into electricity and heat, transferring the heat through the thermally conductive heat pipes and absorbing the heat by the reflector serving a dual purpose as a heat sink. A reduction in weight and cost is accomplished by incorporating the flat heat pipes.

15 Claims, 7 Drawing Sheets

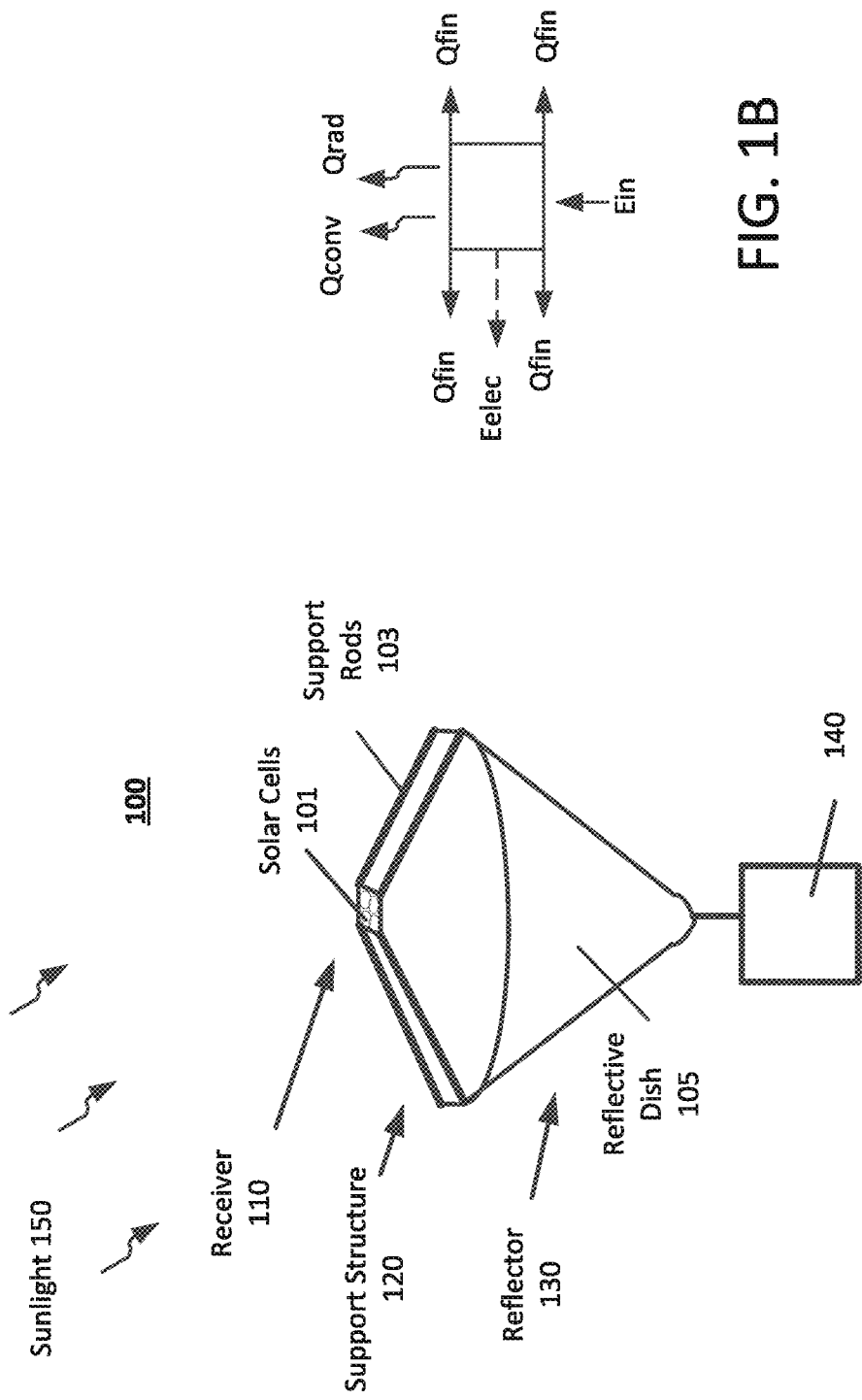

PRIOR ART

PASSIVE COOLING METHOD FOR HIGH CONCENTRATING PHOTOVOLTAIC

CROSS-REFERENCE TO RELATED APPLICATIONS

The present application is a Divisional of U.S. application Ser. No. 17/088,695, having a filing date of Nov. 4, 2020, now allowed.

BACKGROUND OF THE INVENTION

Field of the Invention

The present disclosure is directed to a passive cooling technique, system and apparatus to enhance concentrated solar energy efficiency, and in particular a passive cooling technique, system and apparatus based on existing components of a high concentrating solar device and heat pipes for transferring heat between the components.

Description of the Related Art

Solar energy is an abundant, renewable, and environmentally friendly source of energy and is expected to provide a significant part of future global electricity needs. However, solar energy systems are still uncompetitive compared to conventional oil/gas energy systems. See D. L. Talavera, P. Pérez-Higueras, F. Almonacid, E. F. Fernández, A worldwide assessment of economic feasibility of HCPV power plants: Profitability and competitiveness, Energy. 119 (2017) 408-424, doi.org/10.1016/j.energy.2016.12.093, incorporated herein by reference in its entirety.

Concentrator photovoltaic (CPV) systems provide a possible solution to reducing the cost and increasing the efficiency of solar energy systems as they replace expensive solar cells with small, highly efficient, multi-junction solar cells and a concentrator to focus sunlight onto multi-junction solar cells. The concentrator may be a reflective dish that focuses sunlight on the solar cells. Reflection may be implemented using mirrors. The concentrator may also be a polished metal mirror made of a low-cost high-reflective material such as polished aluminum or steel with silver coating.

The multi-junction solar cells used in CPV systems are solar cells with multiple p-n junctions made of semiconductor materials. Each p-n junction produces electric current in response to different wavelengths of light. The use of multiple semiconducting materials allows absorbance of a broader range of wavelengths, thereby improving the cell's sunlight to electrical energy conversion efficiency. Multi-junction cells having multiple semiconducting materials are more expensive than single junction photovoltaic solar cells. On the other hand, the area of a multi-junction solar cell is much smaller than the area of a single junction cell. A multi-junction solar cell that has three layers is referred to as a triple junction solar cell.

CPV systems may use solar trackers and a cooling system to increase their efficiency. CPV systems operate most effectively on highly concentrated sunlight. CPV systems benefit from solar trackers as the trackers keep direct sunlight focused on the solar cells. Trackers align the optical axis of the concentrator with incident solar radiation to maximize energy efficiency. The trackers can improve energy efficiency by compensating for the variation between dawn and sunset is a range of about 75 degrees to east and west. Rotating solar panels toward east and west to track direct sunlight can help capture sunlight that would otherwise be lost. A tracker that compensates for east-west movement of the sun is known as a single-axis tracker. A tracker that compensates for both the daily and seasonal motions is known as a dual-axis tracker. Also, a cooling system may improve energy efficiency since PV solar cell efficiency decreases with increasing temperature.

On the other hand, a problem with CPV systems is that they must compensate for high temperatures resulting from the highly concentrated sunlight. Despite higher energy efficiencies from multi-junction cells with concentrators, the largest part of the incoming solar energy is converted into heat, which can lead to an increase in cell temperature. The high temperature resulting from concentrating incident light from a large area of the reflector into a small area of a receiver leads to regression in the electric conversion efficiency.

As a consequence, CPV systems operate most efficiently when the solar cells are kept cool, for example, in the range of 50° C. and 80° C. This is because the higher temperatures which arise under sunlight concentration may degrade the cell's I-V properties or, worse, may cause permanent physical damage. To prevent irreversible damage, the rise in cell operating temperature under concentration is typically controlled with the use of a suitable heat sink.

A cooling system typically constitutes a separate system that contributes more than 60% of the total weight and 30-40% of the total cost of the CPV system. See L. Micheli, E. F. Fernández, F. Almonacid, T. K. Mallick, G. P. Smestad, Performance, limits and economic perspectives for passive cooling of High Concentrator Photovoltaics, Sol. Energy Mater. Sol. Cells. 153 (2016) 164-178. doi.org/10.1016/j.solmat.2016.04.016; and S.P. [Fraunhofer I. for S.E.S.I.S.E. Philipps Freiburg (Germany)], A.W. [Fraunhofer I. for S.E.S.I.S.E. Bett Freiburg (Germany)], K. [National R.E.L. (NREL) Horowitz Golden, Colo. (United States)], S. [National R.E.L. (NREL) Kurtz Golden, Colo. (United States)], Current Status of Concentrator Photovoltaic (CPV) Technology, United States, 2015. doi:10.2172/1351597, each incorporated herein by reference in their entirety. Researchers studied extensively different cooling designs for such kind of a problem. See L. Micheli, S. Senthilarasu, K. S. Reddy, T. K. Mallick, Applicability of silicon micro-finned heat sinks for 500{\texttimes} concentrating photovoltaics systems, J. Mater. Sci. 50 (2015) 5378-5388. doi:10.1007/s10853-015-9065-2; L. Micheli, K. S. Reddy, T. K. Mallick, Plate Micro-fins in Natural Convection: An Opportunity for Passive Concentrating Photovoltaic Cooling, Energy Procedia. 82 (2015) 301-308. doi.org/10.1016/j.egypro.2015.12.037; W. G. Anderson, S. Tamanna, D. B. Sarraf, P. Dussinger, Heat pipe cooling of concentrating photovoltaic (CPV) SYSTEMS, in: 2008 33rd IEEE Photovolt. Spec. Conf., 2008: pp. 1-6. doi: 10.1109/PVSC.2008.4922577; W. G. Anderson, P. M. Dussinger, D. B. Sarraf, S. Tamanna, Heat pipe cooling of concentrating photovoltaic cells, in: 2008 33rd IEEE Photovolt. Spec. Conf., 2008: pp. 1-6. doi:10.1109/PVSC.2008.4922577; A. Hasan, J. Sarwar, A. H. Shah, Concentrated photovoltaic: A review of thermal aspects, challenges and opportunities, Renew. Sustain. Energy Rev. 94 (2018) 835-852. doi.org/10.1016/j.rser.2018.06.014; R. Daneshazarian, E. Cuce, P. M. Cuce, F. Sher, Concentrating photovoltaic thermal (CPVT) collectors and systems: Theory, performance assessment and applications, Renew. Sustain. Energy Rev. 81 (2018) 473-492. doi.org/10.1016/j.rser.2017.08.013; S. Wang, J. Shi, H.-H. Chen, S. R. Schafer, M. Munir, G. Stecker, W. Pan, J.-J. Lee, C.-L. Chen, Cooling design and evaluation for photovoltaic cells within constrained space in a CPV/CSP hybrid solar system, Appl. Therm. Eng. 110 (2017) 369-381. doi.org/10.1016/j.appltherma-leng.2016.08.196; A. Akbarzadeh, T. Wadowski, Heat pipe-based cooling systems for photovoltaic cells under concentrated solar radiation, Appl. Therm. Eng. 16 (1996) 81-87. doi.org/10.1016/1359-4311(95)00012-3; and A. Aldossary, S. Mahmoud, R. A L-Dadah, Technical feasibility study of passive and active cooling for concentrator PV in harsh environment, Appl. Therm. Eng. 100 (2016) 490-500. doi.org/10.1016/j.applthermaleng.2016.02.023, each incorporated herein by reference in their entirety.

Limiting the weight of tracked components is important in order to minimize the load on the tracker and thus its energy consumption and its volume. Along with the weight of the tracked components, the tracker is required to withstand wind forces, whose torque effect increases with the weight of the solar modules and the supporting structure. In order to minimize weight of the cooling system, heat sinks are generally made of aluminum.

High concentrator photovoltaics (HCPV) systems employ concentrating light concentrators in order to increase efficiency. Types of light concentrators may include lenses, reflective dishes, and light guide optics (mirrors). Light concentrators consisting of dish reflectors can concentrate sunlight to the intensities of 1,000 suns or more. Solar cells subject to such high light concentration require high-capacity heat sinks to avoid being over heated. The heat sinks may be passive in order to minimize a decrease in energy conversion efficiency. Some heat sinks may include liquid cooling as an efficient way of removing heat.

Light weight heat sinks can reduce the cost of HCPV by reducing the amount of material, minimizing the energy consumption of the tracker and enhancing the electrical performance of the solar cells. A typical passive cooling solution in HCPV systems is the use of a metal plate heat sink, for example an aluminum plate. Also, the heat sink may include fins as an effective way to further reduce the solar cell temperature. Micro-finned arrays are a cooling solution that offer benefits in terms of thermal performance and reduced amount of material usage.

The maximum multi-junction solar cell operating temperatures are less than about 110° C. A system receiver having multi-junction solar cells must provide for highly efficient and uniform cell cooling through sufficiently robust passive methods in order to avoid overheating.

It is one object of the present disclosure to describe a passive cooling method, system and apparatus for high concentrating photovoltaic that uses conductive heat pipes to support the photovoltaic receiver and thermally connect the photovoltaic to a parabolic dish reflector to provide a thermally active reflector that serves a dual purpose as a heat sink. In some aspects, the conductive heat pipes are flat heat pipes having their widest sides parallel to the incident light to reduce shading. The cooling method reduces the total weight of the HCPV system by about 60% or greater and the total cost by about 30-40%.

SUMMARY

In an exemplary embodiment, a method of passive cooling for a high concentrating photovoltaic, the high concentrating photovoltaic, includes a photovoltaic receiver, a parabolic dish reflector and a plurality of thermally conductive support braces having a direct thermal contact between the receiver and the reflector to transfer excessive heat. The method includes receiving sunlight by the parabolic dish reflector, reflecting the sunlight towards the photovoltaic receiver that converts the sunlight into electricity and heat, transferring the heat through the thermally conductive support braces and absorbing the heat by the reflector serving a dual purpose as a heat sink. An aspect is a high concentrating photovoltaic that incorporates flat heat pipes, which include a sealed structure containing a working fluid, as the thermally conductive support braces.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIG. 1A. is a schematic diagram of a perspective view of the HCPV system having rod supports;

FIG. 1B illustrates energy balance of the receiver in accordance with an exemplary aspect of the disclosure;

DETAILED DESCRIPTION

Figure 2B:
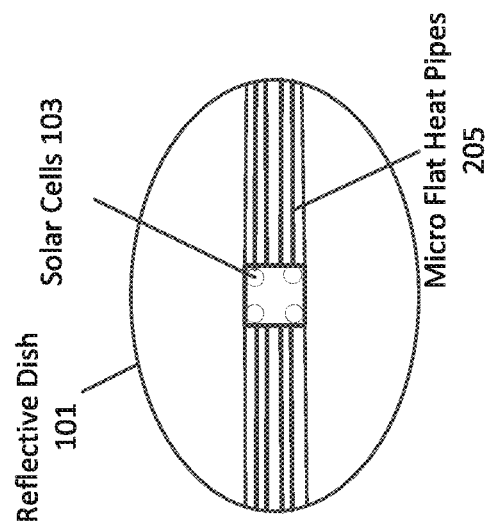
FIG. 2B is a top view of the HCPV system in accordance with an exemplary aspect of the disclosure.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

A standard residential solar panel is about 65 inches by 40 inches, contains 60 cell modules and has a weight of about 37 to 41 pounds. A standard residential solar panel presently has an efficiency of between 15% and 23% and may generate an output of about 280 to 360 Watts.

High concentration photovoltaics (HCPV) have achieved efficiencies of 45% with triple junction solar cells. The HCPV may include triple junction solar cells as the photovoltaic receiver and a parabolic reflective dish as a concentrator. Typically a rise in the cell operating temperature of the solar cell exposed to concentrated sunlight is mitigated/controlled with a heat sink device. An object of the present disclosure is to provide a cooling solution for a HCPV system that does not require additional components, i.e., makes use of the HCPV structure itself.

In some embodiments of the present disclosure, the receiver (e.g., a multi-junction solar cell) is supported over the reflector by aluminum support rods. Aluminum is thermally conductive and the support rods may be configured to serve a dual purpose of conducting heat to the reflector as well as supporting the receiver. Also, the reflector may be configured to serve a dual purpose of reflecting light toward the receiver and absorbing excessive heat as a heat sink. FIG. 1A is a schematic diagram of a perspective view of the HCPV system having aluminum support rods or bars and FIG. 1B illustrates energy balance of the receiver in accordance with an exemplary aspect of the disclosure. The HCPV system 100 includes a receiver 110 and a reflector 130 connected by struts, such as the aluminum support rods or bars, as a support structure 120. The aluminum support rods or bars may be hollow or solid. The receiver 110 may include multi-junction solar cells 101 attached to an aluminum back plate via an adhesive material.

In some embodiments, the multi-junction solar cells 101 may be triple-junction solar cells or multi-junction solar cells with a higher number of junctions. With the aid of a solar concentrator, such as reflector 130, a single triple-junction solar cell is approximately equivalent in performance to about 600 standard single junction solar cells, where each cell is about 16 cm$^2$. Thus, multi-junction solar cells such as a triple junction solar cell with a solar concentrator may offset an initially higher cost by a reduction in the total number and area of cells.

The reflector 130 may be in the form of a parabolic reflective dish 105. However, various shapes of a reflector 130 are possible as long as they focus light on the solar cells 101. For example, an alternative form of parabolic dish is a cassegrain dish. The parabolic reflective dish 105 may include refractive lens, mirrors or other light guide optics, or may be made with a reflective material or include a reflective surface, such as a reflective coating material. For example, the parabolic reflective dish 105 may be made of steel with a silver coating. In some embodiments, the parabolic reflective dish 105 is preferably made of aluminum with a polished surface and/or a reflective surface deposited on any other light weight material (such as a polymer material). Aluminum is a preferred material as it is light weight and provides good thermal conduction. The parabolic reflective dish 105 may have an outer diameter that is about the same dimension as a standard solar panel, for example 65 inches (about 165 cm). The thickness of the parabolic reflective dish 105 is preferably at least 2 mm. However, the dimensions of the parabolic reflective dish 105 is generally based on the dimensions of the multi-junction solar cells 101 such that sufficient sunlight is focused on each solar cell. In another embodiment of the invention, a concentrating lens such as a Fresnel lens may be mounted under the solar cell such that light reflected from the parabolic mirror is further concentrated before impinging on the solar cell.

In some embodiments, the support structure 120 may be made of a thermally conductive material, and in particular, aluminum or copper. Aluminum is a preferred material as it has a lower density (weight) than copper and is much less expensive than diamond, which has superior thermal conductive properties. The support structure 120 may be aluminum support rods 103 with circular cross section. In some embodiments, the support structure 120 may be aluminum support bars 103 with a rectangular cross section. The aluminum support rods or bars 103 are configured with sufficient strength to hold the solar cells 101 mounted on a backing plate and be of sufficient size to conduct heat to the reflective dish 105. In some embodiments, the aluminum support bars 103 have a rectangular cross section with a width of about 1 cm. The rectangular cross section of the aluminum support bars 103 may be arranged to have surfaces along the length that are set parallel to an orthogonal axis through the photovoltaic receiver. The number of aluminum support rods or bars 103 are arranged to maintain the temperature of the solar cells 101 below 80° C. over the full range of sunlight exposure. Although FIG. 1A shows a pair of support rods 103 on each side of the receiver 110, the support rods 103 may be formed in other arrangements as long as they provide support for the receiver 110 and transfer heat from the solar cells 101 to the reflective dish 105. For example, the support rods 103 may be arranged with a single rod or bar on each side of the receiver 110. Another arrangement may include a tripod in which three equally spaced rods or bars support the receiver 110.

The HCPV system 100 may be controlled by a flexible solar tracker 140 to track direction of direct sunlight. The efficiency of a HCPV system is optimum when the system is configured to track the sun as the parabolic reflective dish 105 is moved to keep sunlight focused on the solar cells. In some embodiments, the solar tracker 140 may be a dual-axis tracker that moves by way of one or more electric motors or one or more hydraulic actuators. The parabolic reflective dish 105 may be mounted on one or more arms of the solar tracker 140. The solar tracker 140 is structurally configured to hold the parabolic reflective dish 105 over the range of loads, over the full range of motion (full elevation range, for example up to about 90 degrees along the horizontal axis and about 45 degrees in the North-South axis such that the range of motion is sufficient to receive the maximum amount of direct sunlight) and over various environmental conditions, e.g., wind gusts of up to 30 mph and dust storms, while being able to reliably and accurately move the position of the parabolic reflective dish 105 in discrete steps of about 0.2° or smaller, or through a continuous movement. In some embodiments, a solar tracker 140 may be mounted to two or more parabolic reflective dishes 105.

Regarding FIG. 1B, both heat conduction and heat radiation occur in the receiver 110. Also, heat is dissipated through the support rods 103 ($Q_{fin}$). Energy from sunlight ($E_{in}$) is received as input to the receiver 110, and electrical energy ($E_{elec}$) is output from the receiver 110.

Provided the structure in FIG. 1A, the parabolic reflective dish 105 and aluminum support rods or bars 103 remove heat from the solar cells 101 and serve as a heat sink, thus alleviating the need to add an additional component as a heat sink.

Figure 2A:
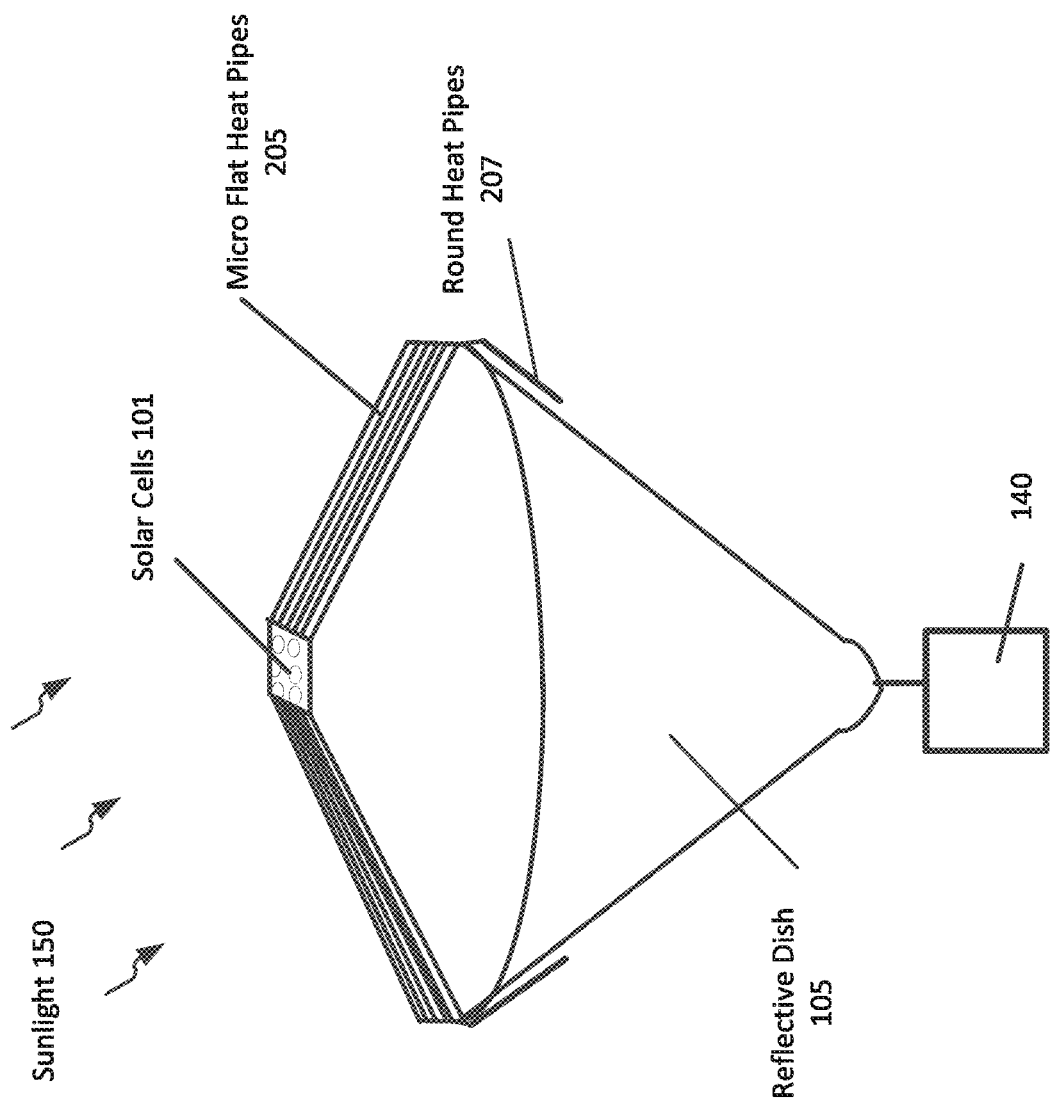
FIG. 2A is a schematic diagram of a perspective view of the HCPV system having flat heat pipes.

In an enhanced embodiment, the aluminum support rods are replaced with heat pipes. FIG. 2A is a schematic diagram of a perspective view of the HCPV system having flat heat pipes and FIG. 2B is a top view of the HCPV system in accordance with an exemplary aspect of the disclosure. The HCPV system with flat heat pipes replaces the aluminum support rods 103 of FIG. 1A with flat heat pipes 205. One difference between the solid aluminum support rods is that the flat heat pipes are a sealed structure, such as a pipe or tube, containing a working fluid that performs a heat transfer function. Also, a flat heat pipe has flattened sides, i.e., not circular. The surfaces of the flat heat pipes 205 may be set parallel to the incident light 210 to minimize the area of the heat pipe that receives incident light and reduce a shading effect. The number of flat heat pipes 205 may be varied based on the size of the parabolic reflective dish 105. The larger the surface area of the parabolic dish, the more flat heat pipes that may be used to carry heat to the parabolic reflective disk 105, which serves a dual purpose of reflecting light toward the receiver 110 and absorb excessive heat from the receiver 110 as a heat sink. In addition, the parabolic reflective dish 105 may include tubular heat pipes 207 having their evaporators and condensers attached to the flat heat pipes 205 and parabolic reflective dish 105, respectively. The tubular heat pipes 207 may enable simplified connection of the flat heat pipes 205 to the parabolic reflective dish 105 and may circle the parabolic dish is a coil type fashion in direct contact with the surface of the reflector (alternately a flat heat pipe may be used for this purpose for better heat conduction to the reflector). Also, the tubular heat pipes 207 may enable flexibility in the placement position of the flat heat pipes and/or accommodate a length of flat heat pipes that may differ from the distance from the solar cells 101 to the reflective dish 105.

Heat pipe technology employs evaporative cooling to transfer thermal energy from one point to another by two-phase flow, i.e., the evaporation and condensation, of a working fluid. A heat pipe typically consists of a sealed pipe or tube, also referred to as an envelope, containing the working fluid and a wick structure. During operation, heat input vaporizes the liquid working fluid inside the wick in an evaporator section. The hot vapor flows towards a cooler condenser section. In the condenser, the vapor condenses thereby releasing heat. The condensed liquid returns to the evaporator through the wick structure by capillary action. The phase change process and two-phase flow circulation continue as long as the temperature gradients between the evaporator and condenser are maintained.

The envelope material (e.g., the material which defines the inner and outer circumference of the heat pipes), working fluid and wick material must be compatible, meaning that the working fluid should not attack or corrode the envelope or wick and there should be no chemical reaction between the working fluid and the envelope or wick structure that liberates non-condensable gas.

Heat pipes may be a tubular structure or a flat structure. A tubular structure heat pipe may efficiently transfer heat from the evaporator section to the condenser section. A flat structure may spread heat out. In other words, a flat heat pipe provides an addition heat transfer function as a heat spreader. Also, a flat heat pipe has a heat transfer capacity and pressure bearing capacity that are much greater than a round heat pipe. To construct a heat pipe, the heat pipe is partially filled with the working fluid and then sealed. The working fluid mass is chosen so that the heat pipe contains both vapor and liquid over the operating temperature range. In some embodiments, the working fluid is distilled water. In some embodiments, the envelope is thermally conductive material such as aluminum or copper. High temperature heat pipes may be constructed with a superalloy envelope and an akali metal (cesium, potassium, sodium) working fluid. A superalloy is an alloy that is resistant to thermal creep deformation and resistant to corrosion and oxidation, and is particularly suited for high temperature applications. Typical superalloys are nickel based and may include one or more alloying elements of carbon, chromium, molybdenum, tungsten, niobium, iron, titanium, aluminum, vanadium, and tantalum.

In the present disclosure heat pipes can be used to passively remove the waste heat at the CPV cell level, and reject the heat to ambient through natural convection. A typical design uses a copper/water tubular heat pipe to remove heat and aluminum fins to cool the CPV cell by natural convection. The cell level waste heat flux of this typical design has achieved 40 W/cm$^2$. The aluminum fins served as a heat sink and rejected the heat to the environment by natural convection, with a total cell-to-ambient temperature rise of only 40° C. In the present disclosure the reflector is used to dissipate heat from the heat pipe in lieu of or in addition to fins.

Figure 3:
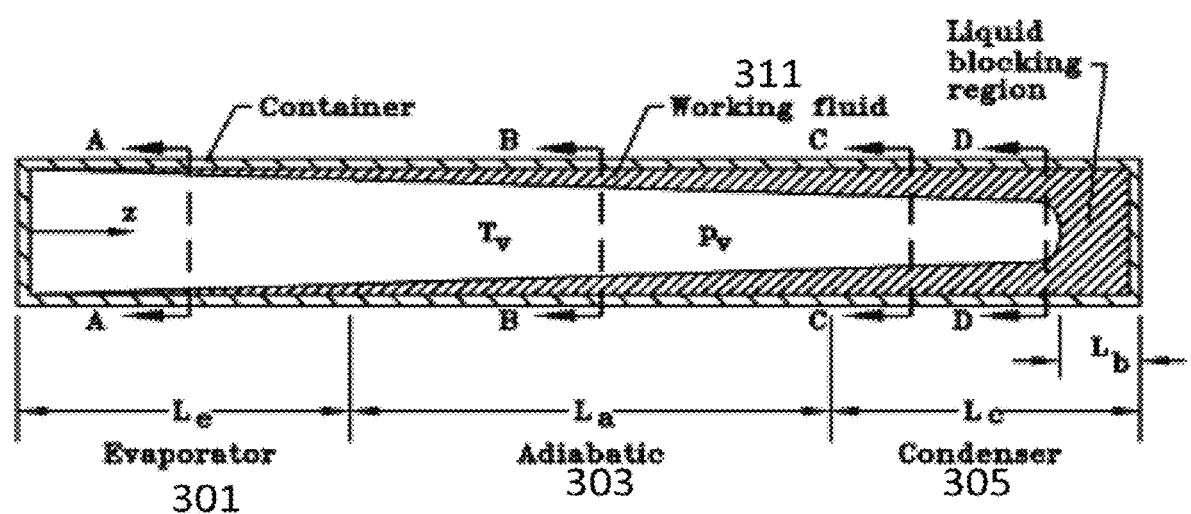
FIG. 3 is a schematic diagram of a heat pipe.

It is desirable to minimize the thermal spreading resistance so that thermal conductivity may be maximized. The heat pipes may have convex but cusped cross sections (for example, a polygon), with hydraulic diameter in range of 10 to 500 μm. FIG. 3 is a side view of a flat heat pipe. The interior cross section A-A of the evaporator section 301 may be a rounded triangular shape while the interior cross section D-D of the condenser section 305 may be a circle. The interior cross section B-B of the adiabatic section 303 may have transition shapes, more rounded than in the evaporator section 301 closer to the condenser end 305. This transition in shape is such that liquid of working fluid 311 return from condenser 305 to evaporator 301 is by capillary force and occurs in the sharp corner of the channel.

A micro-flat heat pipe is a type of flat heat pipe that includes an interior cross section of the evaporator section 301 that is wide and flat and includes micro channels in order to minimize the spreading resistance by circulating the working fluid. The micro channels may be diagonal trapezoidal channels.

In some embodiments, heat pipes 205 (e.g., micro-flat heat pipes) are used to transfer heat between a solar cell receiver 110 and the parabolic reflective dish 105. Using heat pipes 205 to join the receiver 110 with the reflector 130, instead of using aluminum support rods 103, may transfer heat from the receiver 110 to the reflector 130 in an almost isothermal process. Using heat pipes 205 to join the receiver 110 with the reflector 130 may enable the parabolic dish 105 to have an added feature of being a thermally active body. Using the parabolic reflective dish 105 as a thermally active reflector, instead of being thermally inactive, can avoid the need to add a conventional heat sink to the HCPV system and hence reduce the weight by about 60% or greater and the cost by about 30-40%.

Experimental HCPV System

An experimental investigation was performed to compare an HCPV system having aluminum rod supports with an HCPV system having thermally conductive heat pipes. Specifically, the experimental investigation determined the effect of using the thermal conductive technique on the operating temperature of the solar cell. Further, the investigation determined the effect of using thermally conducting heat pipes on the efficiency of the solar cell. Both analytical and experimental temperature distribution were obtained on the solar cells, heat pipes, and parabolic dish surface.

Experimental Method

The disclosed HCPV system was experimentally examined and evaluated. The HCPV system was evaluated by solving the energy conservation equation with proper boundary conditions. A closed form analytical expression was obtained for the temperature distribution, and the solar cell efficiency was then calculated. Details of the evaluation are presented. The experimental procedure may be performed by conduction experiments to test the disclosed technique using a parabolic dish made of carbon steel as a reflector and triple-junction solar cells as a receiver. Details of the experimental procedure are presented below.

Analytical Solution

Two different analytical solutions are presented. The first solution is for a HCPV system having aluminum rod supports (Case A), while the second one is for the HCPV system where the flat heat pipes are used in place of aluminum rod supports (Case B).

The System Case A

Applying energy conservation to the control volume about the receiver as shown in FIG. 1B, it follows that $E_{in} = E_{out}$ $E_{in} = I \times A_{ref} \eta$ [1]

$E_{out} = Q_{conv} + Q_{rad} + Q_{fins} + E_{elec}$ [2]

Where $Q_{conv}$ represents heat by convection, $Q_{rad}$ represents heat by radiation, $Q_{fins}$ represents heat transferred in the aluminum rods (fins), $E_{in}$ represents energy from sunlight, I is current, and $E_{elec}$ represents electrical energy, $A_{ref}$ represents the area of the parabolic reflective dish 105. The $\eta$ represents efficiency of the reflective dish 105.

$E_{elec} = E_{in} \times \eta_{elect}$ $Q_{rad} = \delta \varepsilon (T_S^4 - T_\infty^4) * A_{ref}$ $Q_{con.} = h_{air} * A_{ref}(T_S - T_\infty)$ $Q_{fins} = 4 * \sqrt{h_{air} P_{fin} K_{fin} A_{cf}}(T_S - T_\infty)$ $\Rightarrow I * \pi r^2 * \eta_{opt} = \delta \varepsilon * A_{ref} * (T_S^4 - T_\infty^4) + h_{air} * A_{ref} * (T_S - T_\infty) + n * \sqrt{h_{air} * P_{fin} * K_{fin} * A_{cf}} * (T_S - T_\infty)$ Where Q is heat transfer, $T_S$ is surface temperature, $T_\infty$ is environmental or ambient temperature, $P_{fin}$ is fin perimeter, $K_{fin}$ is the thermal conductivity (W/mK) of the fin material, $h_{air}$ is the convection heat transfer coefficient of air, and n represents number of fins (rod supports)

$\Rightarrow \delta \varepsilon * A_{ref} T_S^4 + [h_{air} * A_{rec} * T_S + n * \sqrt{h_{air} * P_{fin} * K_{fin} * A_{cf}}]T_S - \delta \varepsilon * A_{ref} T_\infty^4 - [h_{air} * A_{ref} * T_\infty - n * \sqrt{h_{air} * P_{fin} * K_{fin} * A_{cf}}]T_\infty - I \pi r_0^2 \mu_{opt} = 0$ or $aT_s^4 + bT_s + c = 0$ where $r_0$ is inner radius, $a = \delta \varepsilon A_{ref}$, $b = h_{air} A_{ref} + n \sqrt{h_{air} * P_{fin} * K_{fin} * A_{cfin}}$ and $c = -\delta \varepsilon A_{ref} T_\infty^4 - h_{air} * A_{ref} * T_\infty - n * \sqrt{h_{air} * P_{fin} * K_{fin} * A_{cfin}} T_\infty - I \pi r_0^2 \eta_{opt}$ The analytical solution of the above equation can be written in the following form $$T_s = \frac{1}{2}\sqrt{\frac{c_1}{\sqrt[3]{c_2}} + \frac{\sqrt[3]{c_2}}{c_3}} - \frac{1}{2}\sqrt{-\frac{2b}{\sqrt{\frac{c_1}{\sqrt[3]{c_2}} + \frac{\sqrt[3]{c_2}}{c_3}}} - \frac{\sqrt[3]{c_2}}{c_3} - \frac{c_1}{\sqrt[3]{c_2}}}$$ [3]

where $c_1 = 4\sqrt[3]{\frac{2}{3}c}$ $c_2 = \sqrt{3}\sqrt{27a^2b^4 - 256a^3c^3 + 9ab^3}$ $c_3 = \sqrt[3]{2} \cdot 3^{\frac{2}{3}} a$ The System Case B In this case thermally conducting heat pipes will be used instead of regular rod support to hold and connect the receiver to the reflector. One of the wonderful feature of the heat pipes are that they work at almost isothermal operation (they providing isothermal surfaces) and can effectively transfer heat from the receiver to the reflector and make it normally active (i.e. can be used as a heat sink). By replacing the regular supporting rod with the heat pipes and connect them to the parabolic dish equation [2] becomes $E_{out} = Q_{conv} + Q_{rad} + Q_{hp} + Q_{dish} + E\text{elec}$ [4]

Where $Q_{hp}$ represents the heat transfer to the environment through the surface of the heat pipes and $Q_{dish}$ is the amount of heat dissipated through the surface of the reflector.

Figure 4:
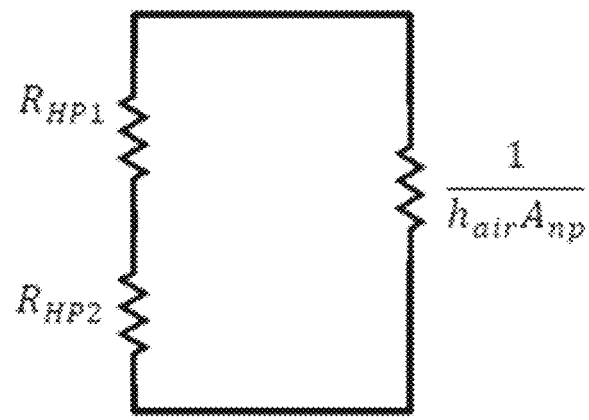
FIG. 4 is a circuit diagram for a resistive network for heat pipes in accordance with an exemplary aspect of the disclosure.

$Q_{hp}$ can be approximately obtained by using the normal resistance network taking into account the internal resistance of the heat pipe as shown in FIG. 4.

Thus, the heat transfer through the heat pipes surface can be obtained as follows $$Q_{HP} = \frac{T_s - T_\infty}{\sum R} = \frac{(1 + nR_{HP} h_{air} A_{hp})(T_s - T_\infty)}{nR_{HP}}$$

The heat transfer through the parabolic dish can be derived using Garalkin' method. By using two-dimension flow (in r and θ direction) and approximating the parabolic shape to the circular shape, we can write its energy equation in polar coordinate as follows.

$$\frac{1}{r}\frac{\partial}{\partial r}\left(r\frac{\partial T}{\partial r}\right) + \frac{1}{r^2}\left(\frac{\partial T}{\partial \theta}\right) - \frac{h_{air} P_{dish}}{K_{dish} A_{c\,dish}}(T_s - T_\infty) = 0$$ [5]

where $0 \leq r \leq r_0$ and $0 \leq \theta \leq \pi/2$

It is worth mentioning here that due to temperature symmetry we can solve only quarter circle of the parabolic dish.

Figure 5:
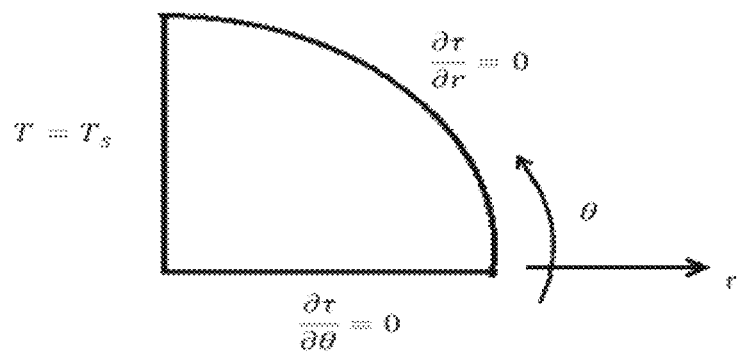
FIG. 5 illustrates geometry for a solution and boundary conditions.

The boundary conditions are shown in FIG. 5 in radians r and angle θ and can be written as at $\theta = 0$  $\frac{\partial y}{\partial \theta} = 0$ at $\theta = \frac{\pi}{2}$  $\tau = T_\infty$ at $r = R$  $\frac{\partial \tau}{\partial r} = 0$ Equation [1] can written as $$\int_0^R \int_0^{\frac{\pi}{2}} \left[\frac{1}{r}\frac{\partial}{\partial r}\left(\tau \frac{\partial}{\partial r}\right) + \frac{1}{r^2}\frac{\partial^2 \tau}{\partial \theta} - \beta\tau\right]\phi_1(r, \theta) d\theta dr = 0$$ [6]

$\tau(r, \theta) = c_1 \phi_1(r, \theta) + T_s$ $\phi(r, \theta) = (r^2 - 2Rr)\cos\theta$ $\frac{\partial \tau}{\partial r} = c_1 \cos\theta(2r - 2R)$ $r\frac{\partial \tau}{\partial r} = c_1 \cos\theta(2r^2 - 2rR)$ -continued $$\frac{\partial}{\partial r}\left(r\frac{\partial \tau}{\partial r}\right) = c_1\cos\theta(4r - 2r)$$

$$\frac{1}{r}\frac{\partial}{\partial \tau}\left(r\frac{\partial \tau}{\partial r}\right) = c_1\cos\theta\left(4 - \frac{2R}{r}\right)$$

$$\frac{\partial \tau}{\partial \theta} = -c_1(r^2 - 2Rr)\sin\theta$$

$$\frac{\partial^2 T}{\partial \theta^2} = -c_1(r^2 - 2Rr)\cos\theta$$

$$\frac{1}{r^2}\frac{\partial^2 \tau}{\partial \theta^2} = -c_1\left(1 - \frac{2R}{r}\right)\cos\theta$$

$$\Rightarrow \int_0^R \int_0^{\frac{\pi}{2}} \left\{c_1\cos\theta\left(4 - \frac{2R}{r}\right) - c_1\cos\theta\left(1 - \frac{2R}{r}\right) - \beta[(c_1)(r^2 - 2Rr)\cos\theta + T_s]\right\}(r^2 - 2Rr)\cos\theta \cdot d\theta \, dr = 0$$

$$\Rightarrow \int_0^R \int_0^{\frac{\pi}{2}} [(3c_1\cos\theta) - \beta c_1(r^2 - 2rR)\cos\theta - \beta T_s](r^2 - 2Rr)\cos\theta \cdot d\theta \, dr = 0$$

$$\Rightarrow \int_0^R \int_0^{\frac{\pi}{2}} \{c_1 3\cos^2\theta(r^2 - 2Rr) - \beta T_s(r^2 - 2rR)^2\cos^2\theta - \beta T_s(r^2 - 2Rr)\}\cos\theta \cdot d\theta \, dr = 0$$

$$\Rightarrow \int_0^R c_1 3(r^2 - 2Rr)\left\{\frac{1}{2}\theta + \frac{1}{4}\sin 2\theta\right\}_0^{\frac{\pi}{2}} - \int_0^R \beta c_1(r^2 - 2rR)^2 \left\{\frac{1}{2}\theta + \frac{1}{4}\sin 2\theta\right\}_0^{\frac{\pi}{2}} \int_0^R - \beta T_s(r^2 - 2Rr)\sin\theta\Big|_0^{\frac{\pi}{2}} \, dr = 0$$

$$\Rightarrow \int_0^R \frac{4}{3}\pi c_1(r^2 - 2Rr) - \int_0^R \frac{1}{4}\pi\beta c_1(r^2 - 2rR)^2 - \int_0^R \beta T_s(r^2 - 2Rr) \, dr = 0$$

$$\Rightarrow (r^2 - 2Rr)^2 = r^4 + 4r^2 R^2 - 4r^3 R$$

$$\Rightarrow \frac{3}{4}\pi c_1 \left|\frac{r^3}{3} - 2R\frac{r^2}{2}\right|_0^R - \frac{1}{4}\pi\int 3c_1\left|\frac{r^5}{5} + \frac{4}{3}r^3 R^2 - r^4 R\right|_0^R - \beta T_s\left|\frac{r^3}{3} - 2R\frac{r^2}{2}\right|_0^R = 0$$

$$\Rightarrow -\frac{1}{2}\pi c_1 R^3 - \frac{8}{60}\pi\beta c_1 R^5 + \beta T_s \frac{2}{3}R^3 = 0$$

$$\Rightarrow c_1\left[-\frac{1}{2}\pi R^3 - \frac{4}{30}\pi\beta R^5\right] + \beta T_s \frac{2}{3}R^3 = 0$$

$$\Rightarrow c_1 = \frac{\frac{2}{3}\beta T_s R^3}{\frac{1}{2}\pi R^3 + \frac{4}{30}\pi\beta R^5}$$

$$\Rightarrow c_1 = \frac{2\beta T_s}{\left[\frac{3}{2}\pi + 0.4\pi\beta R^2\right]}$$

$$\Rightarrow c_1 = \frac{2\beta T_s}{\pi[1.5 + 0.4\beta R^2]}$$

$$\Rightarrow \tau(r, \theta) = \frac{2\beta T_s}{\pi[1.5 + 0.4\beta R^2]}(r^2 - 2Rr)\cos\theta + T_s$$

$$\Rightarrow \tau(r, \theta) = T_s\left[\frac{2\beta(r^2 - 2Rr)\cos\theta}{\pi(1.5 + 0.4\beta R^2)} + 1\right]$$

$$\beta = \frac{hp}{hA_c} = \frac{20*\pi R^2}{200*R*0.001} \text{ For } R = 1 \text{ and } \beta = 316$$

$$\tau = T_s\left[\frac{-316}{3.14(1.5 + 0.4 + 316)} + 1\right]$$

$$= T_s\left[\frac{-316}{401} + 1\right]$$

$$= \delta[-0.78 + 1] = 0.22T_s$$

$$\frac{\partial \tau}{\partial \theta}\bigg|_{\theta=\frac{\pi}{2}} = -T_s\sin\theta\left[\frac{2\beta(r^2 - 2Rr)}{\pi(1.5 + 0.4\beta R^2)}\right]$$

$$q = +kA\frac{dT}{d\theta}\bigg|_{\theta=\frac{\pi}{2}}$$

$$\Rightarrow q = -T_s k * 0.001 * \int_0^R \left[\frac{2\beta(r^2 - 2Rr)}{\pi(1.5 + 0.4\beta R^2)}\right] dr$$

$$q = -0.2 * \left[\frac{2\beta \cdot \left(\frac{R^3}{3} - R^3\right)}{\pi(15 + 0.4\beta R^2)}\right] T_s$$

$$q = -0.2 * \left[\frac{2\beta\left(\frac{(1.5)^3}{3} - (1.5)^3\right)}{\pi(1.5 + 0.4\beta(1.5)^2)}\right] T_s \text{ and } \beta = 316$$

$$q = \frac{7110\tau_b}{157(1.5 + 0.4*316(1.5)^2)} = 0.1584T_s$$

$$420 = \frac{\Delta T_{HP}}{\sum K_{HP}} + 0.6336q_{dish}$$

$$\Rightarrow 420 = \frac{T_s}{0.2857} + 0.1584T_s$$

$$\Rightarrow 420 = \frac{420}{\left(0.1584 + \frac{1}{0.2857}\right)} = \frac{420}{6.95} \approx 60k$$

Prototype

Fabrication of the Receiver

In this disclosure, an aluminum receiver 110 was manufactured as a prototype for the high concentrating solar cells. The parabolic reflective dish 105 was made of carbon steel. Two tools have been used to manufacture the aluminum receiver 110: a laser cutting device and a bending machine. A standard residential solar panel is 65 by 39 inches (about 165 by 99 cm). The prototype receiver has dimensions that are comparable with a standard solar panel.

The following steps were followed to manufacturing the prototype receiver 110.

Figure 6A:
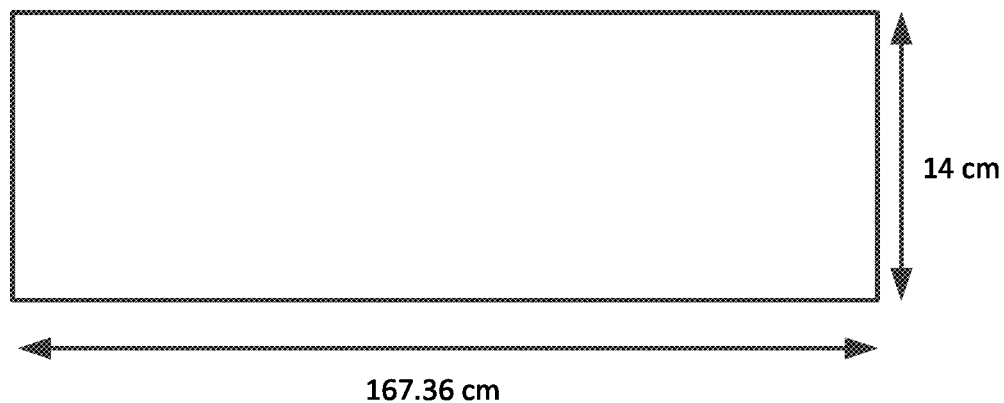
FIGS. 6A, 6B, 6C and 6D illustrate a method of making an exemplary receiver for a prototype of the HCPV system in accordance with an exemplary aspect of the disclosure.

1) As shown in FIG. 6A, manufacturing of the receiver 110 begins with an aluminum sheet with dimensions (167.36×14 cm) and 2 mm thickness.

Figure 6B:
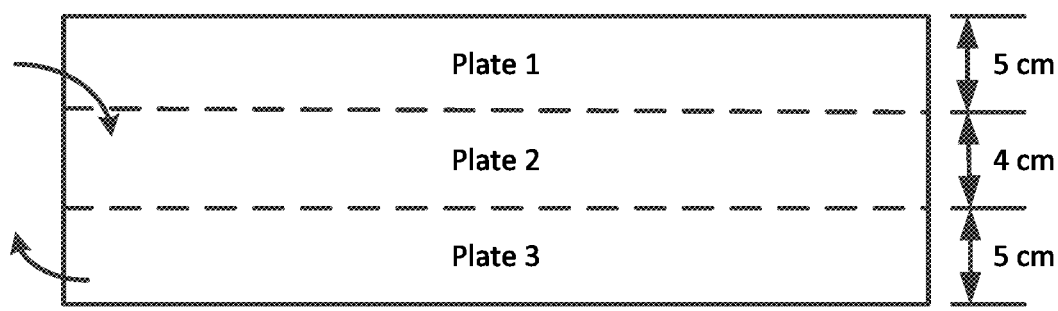

2) As shown in FIG. 6B, this sheet is marked in three plate portions (1,2,3) plate 1 and 3 marked 5 cm and plate 2 was 4 cm. Plate 1 and 3 are bent at 90 degrees with respect to X1 and X11 by using the bending machine.

Figure 6C:
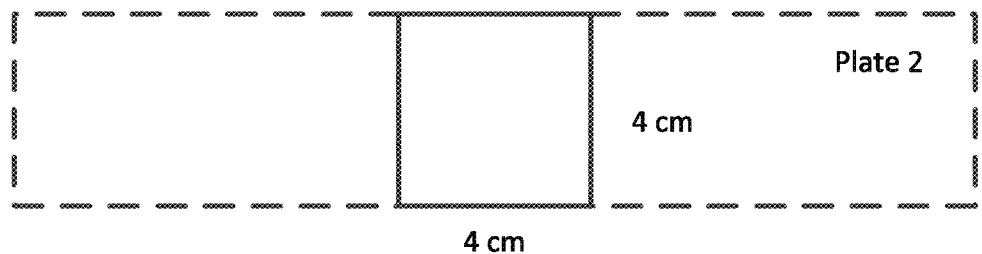

3) As shown in FIG. 6C, plate 2 is marked 4 cm at the center, the side portion of the plate 2 is removed at both sides with the laser cutting device.

Figure 6D:
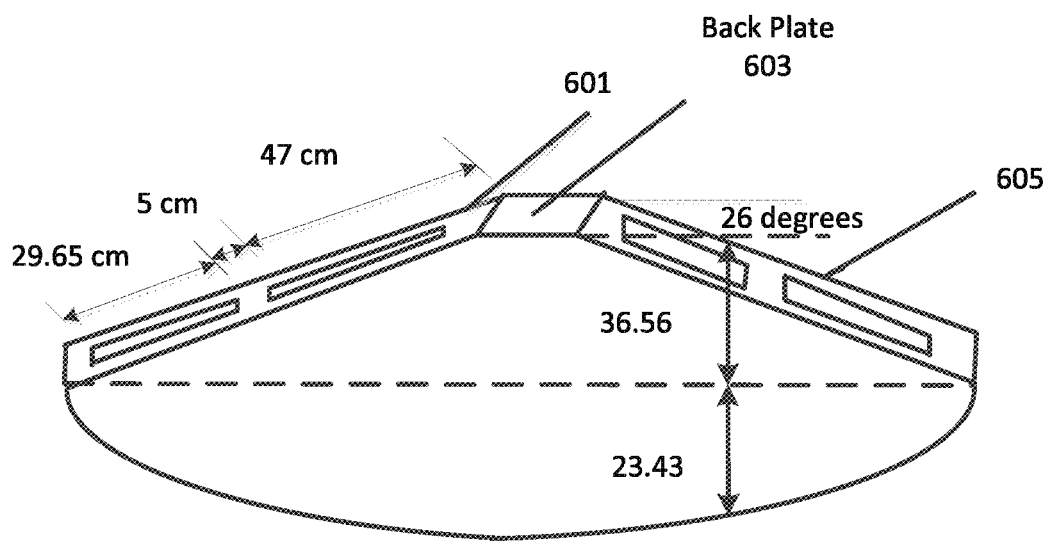

4) As shown in FIG. 6D, some portion is removed at required dimensions beginning at 47 cm and ending at 26.65 cm from plate 1 and plate 3 with the laser cutting device. Plate 1 and plate 3 are connected with a small portion 603 (4 cm) of plate 2. Plates 1 (601) and 3 (605) are connected at 26 degrees at opposite directions.

The methodology used to conduct the experimental process are as follows:

1—16 triple junction solar cells 101 (1 cm*1 cm each) are attached to the 4*4 cm² aluminum back plate via flexible silver epoxy adhesive.

2—The aluminum back plate is connected to the parabolic dish via 8 flat heat pipes 205.

3—Other round heat pipes 207 are used to transfer heat to the parabolic dish where their evaporators and condensers are attached to the flat heat pipes 205 and parabolic dish 105, respectively.

4—The dish 105 and receiver 110 were cleaned for any dust with wet tissue paper to negate the effect of dust particles.

5—The system is set outside a building in a sunny day and the parabolic dish 105 concentrator tracks the sun through a flexible support, such as a dual axis tracker.

6—Data acquisition devices measure the voltage, current, temperature, variable resistance and the measurements are recorded.

7—Also, thermal images are captured by an infrared camera after reaching the steady state condition.

Results and Discussion

Figure 7:
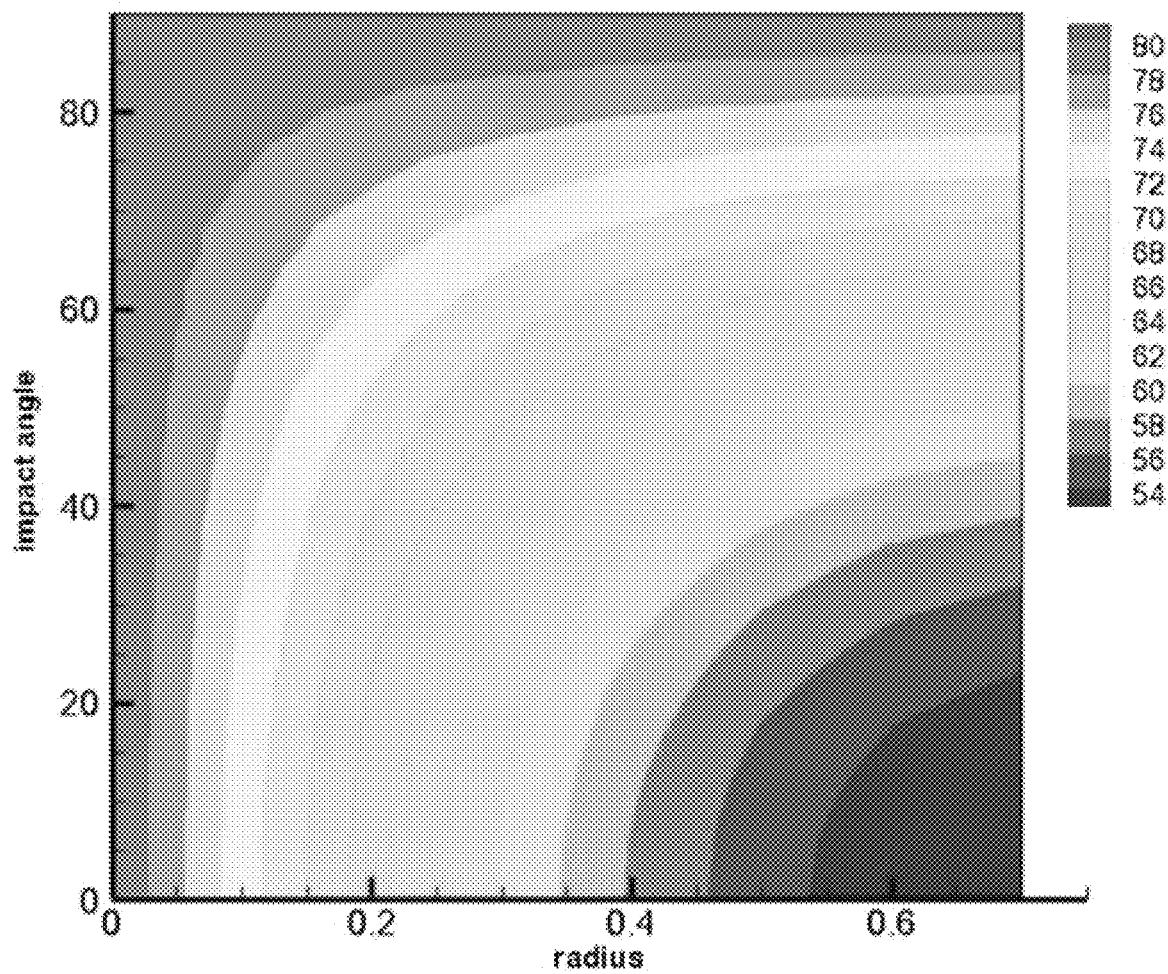
FIG. 7 is an exemplary temperature distribution of the parabolic dish surface.

FIG. 7 shows the temperature distribution on an exemplary parabolic dish surface with diameter 1.5 m and concentration ratio=1000. The temperature distribution was obtained based on the thermal images. It is clear that the parabolic reflective dish 105 becomes thermally active due to the addition of flat heat pipes 205 to the HCPV system.

High concentrating photovoltaic (HCPV) has the potential to produce expanded energy with cheaper optical elements. However, using high solar concentration ratio causes an increase in the temperature of the surface of solar cells which reduces the efficiency and power output from the cell. In this disclosure, a passive cooling technique, system and apparatus are introduced to enhance concentrated solar energy efficiency. The disclosed technique includes replacing aluminum rod supports with conductive heat pipes aiming at having direct thermal contact between receiver and reflector. Thus, the parabolic dish can be used as a reflector and heat sink at the same time. A closed form analytical solution of a high concentrating photovoltaic system based on the disclosed technique has been obtained for temperature distribution, heat transfer rate, and electric conversion efficiency of the solar cells. The results reveal that using the disclosed cooling technique the parabolic dish can be converted from thermally inactive to thermally active surface able to reduce the operating temperature of the solar cell to the acceptable level, without a need to add a heat sink to the system. Moreover, adopting the proposed cooling technique may reduce the total weight of the system by 60% or more and the total cost by 30-40%.

Numerous modifications and variations of the present invention are possible in light of the above teachings. It is therefore to be understood that within the scope of the appended claims, the invention may be practiced otherwise than as specifically described herein.

The invention claimed is:

1. A method of passive cooling for a high concentrating photovoltaic, the method comprising:
receiving sunlight by a parabolic dish reflector;
reflecting the sunlight toward a photovoltaic receiver as a focal point of the reflected sunlight and converting the sunlight into electricity and heat, wherein the photovoltaic receiver includes at least one solar cell optionally comprising a heat sink fin;
transferring the heat from the receiver to the reflector through a plurality of thermally conductive support braces having a direct thermal contact between the receiver and the reflector;
absorbing the heat by the reflector,
wherein the thermally conductive support braces are heat pipes that include a sealed structure containing a working fluid and having a direct thermal contact between the photovoltaic receiver and the reflector to transfer heat away from the photovoltaic receiver and that support the photovoltaic receiver,
wherein the parabolic dish reflector is made of a thermally conductive material and is configured to absorb heat transferred from the photovoltaic receiver via the heat pipes,
wherein the at least one solar cell includes a plurality of multi-junction solar cells,
wherein the heat pipes extend parallel to each other, from a top plan view,
wherein the thermally conductive support braces are support rods or bars, each having a first end directly contacting the photovoltaic receiver and a second end directly contacting the parabolic dish reflector,
wherein the parabolic dish reflector only contacts the photovoltaic receiver via the ends of heat pipes.

2. The method of claim 1, wherein the thermally conductive support braces are flat heat pipes, the method further comprising:
vaporizing the working fluid in an evaporator section of each of the heat pipes;
carrying the latent heat of vaporization as the vapor flows towards a cooler condenser section;
releasing latent heat as the vapor condenses and changes to liquid in the condenser section; and
returning condensed liquid to the evaporator section by capillary action.

3. The method of claim 1, further comprising:
tracking, with the parabolic dish reflector, the sun using a flexible support tracker.

4. The method of claim 1, wherein the at least one solar cell includes a plurality of triple junction solar cells.

5. The method of claim 1, wherein the heat pipes have a rectangular cross section with longer sides that are arranged parallel to an orthogonal axis through the photovoltaic receiver.

6. The method of claim 1, wherein the photovoltaic receiver includes 16 triple junction solar cells attached to an aluminum back plate.

7. The method of claim 1, wherein the heat pipes are flat heat pipes.

8. The method of claim 1, wherein the at least one solar cell are mounted to an aluminum back plate,
wherein the aluminum back plate is connected to the thermally conductive heat pipes.

9. The method of claim 3, wherein the flexible support tracker is configured to move a position of the parabolic dish reflector in increments of about 0.2° or smaller.

10. The method of claim 3, wherein the flexible support tracker is a dual-axis tracker configured to move the parabolic dish reflector over a range of motion to receive the maximum amount of direct sunlight.

11. The method of claim 1, wherein the sealed structure of the flat heat pipes includes micro channels that circulate the working fluid.

12. The method of claim 1, wherein the working fluid is distilled water.

13. The method of claim 1, wherein the working fluid is an alkali metal.

14. The method of claim 1, wherein the sealed structure of the flat heat pipes is made of aluminum.

15. The method of claim 1, wherein the sealed structure of the flat heat pipes is made of copper.

* * * * *